(12) United States Patent
Khoo et al.

(10) Patent No.: US 7,271,614 B2
(45) Date of Patent: Sep. 18, 2007

(54) BUFFER CIRCUIT WITH CURRENT LIMITING

(75) Inventors: Samuel Khoo, Macungie, PA (US);
John C. Kriz, Palmerton, PA (US);
Bernard L. Morris, Emmaus, PA (US)

(73) Assignee: Agere Systems Inc., Allentown, PA (US)

( * ) Notice: Subject to any disclaimer, the term of this patent is extended or adjusted under 35 U.S.C. 154(b) by 153 days.

(21) Appl. No.: 11/094,974

(22) Filed: Mar. 31, 2005

(65) Prior Publication Data

US 2006/0220684 A1    Oct. 5, 2006

(51) Int. Cl.
*H03K 17/16* (2006.01)

(52) U.S. Cl. .......................................... 326/30; 326/86
(58) Field of Classification Search ................ 326/26, 326/27, 30, 83, 86; 327/108, 109, 530
See application file for complete search history.

(56) References Cited

U.S. PATENT DOCUMENTS

| 6,133,755 A | * | 10/2000 | Huang et al. | .................. 326/83 |
| 6,229,335 B1 | * | 5/2001 | Huang et al. | .................. 326/30 |

* cited by examiner

*Primary Examiner*—Daniel Chang

(57) ABSTRACT

A buffer circuit is configured to generate an output signal which is a function of an input signal received by the buffer circuit, the buffer circuit being selectively operative in one of at least two modes in response to a control signal. In a first mode, the buffer circuit is configured to provide a low output impedance, characteristic of a digital buffer. In a second mode, the buffer circuit is configured to limit an output current of the buffer circuit. The control signal is indicative of a level of the output signal of the buffer circuit.

20 Claims, 3 Drawing Sheets

BUFFER CIRCUIT WITH CURRENT LIMITING

FIELD OF THE INVENTION

The present invention relates generally to electronic circuits, and more particularly relates to improved buffer circuits.

BACKGROUND OF THE INVENTION

Buffer circuits (e.g., output buffers and bidirectional buffers) are employed in a variety of electronic devices and applications. There are traditionally digital buffer circuits and analog buffer circuits, each having their own advantages and disadvantages associated therewith. One advantage of digital buffer circuits is their ability to source or sink relatively large currents (e.g., about several tens of milliamperes (mA) or higher), thereby providing a substantially low output impedance drive. This is due, at least in part, to the fact that full-scale digital signals (e.g., VSS to VDD) are used to drive output stages in the digital buffer circuits.

Under certain conditions, however, the low output impedance provided by a given digital buffer circuit presents a problem. For example, when a contention condition arises, which may occur when a logic "high" output of the buffer circuit is somehow shorted to VSS, a large "over current" will be sourced by the output stage in the buffer circuit. Likewise, when a logic "low" output of the buffer circuit is somehow shorted to VDD, a large over current will flow into the output stage of the buffer circuit. This large over current, which may be about 50 mA or higher, can cause reliability problems due, at least in part, to electromigration damage in the metal connecting the output stage devices to a supply voltage and to an output pad. The large over current can also damage the output stage devices themselves.

One conventional solution to reduce electromigration damage resulting from the large over current during a contention condition is to substantially increase the size of the metal connections in the output paths of the output stage devices in the buffer circuit. However, increasing the size of the metal connections significantly increases the overall size of the buffer circuit, and is thus undesirable. Additionally, while it is desirable to be able to limit the current sourcing (or sinking) capability at the output of the buffer circuit under such a contention condition, there is no known means for providing current limiting while at the same time assuring a low output impedance drive under normal operation of the buffer circuit (e.g., when no contention condition exists).

An advantage of analog buffer circuits is that, unlike digital buffer circuits, they generally provide current limiting. This is due primarily to the fact that the output current sourced or sunk by an output stage of an analog buffer circuit is typically generated from a current mirror arrangement, which is biased to some fixed reference current source. Therefore, analog buffer circuits are generally not prone to reliability problems and/or damage resulting from a contention condition. However, because the current sourcing and sinking capabilities of the analog buffer circuit are typically limited, an output impedance drive of the analog buffer circuit is often substantially higher than that of a comparable digital buffer circuit. Depending on the application in which the buffer circuit is employed, the output impedance drive provided by an analog buffer circuit may not be low enough to meet certain output impedance specifications.

Accordingly, there exists a need for an improved buffer circuit that provides a substantially low output impedance and yet does not suffer from one or more of the problems exhibited by conventional buffer circuits.

SUMMARY OF THE INVENTION

The present invention meets the above-noted need by providing, in an illustrative embodiment, an improved buffer circuit having a low output impedance drive, characteristic of a digital buffer, and including a current limiting mechanism, characteristic of an analog buffer, for substantially reducing the likelihood of damage and/or reliability problems caused by a contention condition at an input or output of the buffer circuit. In order to accomplish this, the buffer circuit in the illustrative embodiment is selectively operable in one of at least a low impedance "digital drive mode" and a current-limited "analog drive mode," as a function of a level of an output signal generated by the buffer circuit.

In accordance with one aspect of the invention, a buffer circuit is provided which is configured to generate an output signal that is a function of an input signal received by the buffer circuit, the buffer circuit being selectively operative in one of at least two modes in response to a control signal. In a first mode, the buffer circuit is configured to provide a low output impedance. In a second mode, the buffer circuit is configured to limit an output current of the buffer circuit. The control signal is indicative of a level of the output signal of the buffer circuit.

The buffer circuit may further include an output stage operative to generate the output signal of the buffer circuit, and a control circuit connected to the output stage. In the first mode, the control circuit is operative to generate a signal for driving the output stage which is a function of the input signal received by the buffer circuit. In the second mode, the control circuit is operative to generate the signal for driving the output stage which is a function of a bias signal supplied to the control circuit. The output current of the buffer circuit, in the second mode, is a function of the bias signal.

In accordance with another aspect of the invention, an integrated circuit includes a plurality of buffer circuits, at least a given one of the buffer circuits being configured to generate an output signal that is a function of an input signal received by the buffer circuit, the given buffer circuit being selectively operative in one of at least two modes in response to a control signal. In a first mode, the given buffer circuit is configured to provide a low output impedance. In a second mode, the given buffer circuit is configured to limit an output current of the -buffer circuit. The control signal is indicative of a level of the output signal of the buffer circuit.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of illustrative buffer circuits. It should be understood, however, that the present invention is not limited to these or any other particular circuit arrangements. Rather, the invention is more generally applicable to techniques for assuring a low output impedance drive under normal operation of a buffer circuit (e.g., when no contention condition exists), while at the same time providing current limiting when a contention condition arises. Although implementations of the present invention are described herein with specific reference to P-channel metal-oxide-semiconductor (PMOS) and N-channel metal-oxide-semiconductor (NMOS) transistor devices, as may be formed using a complementary metal-oxide-semiconductor (CMOS) fabrication process, it is to be understood that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be apparent to those skilled in the art.

Figure 1:
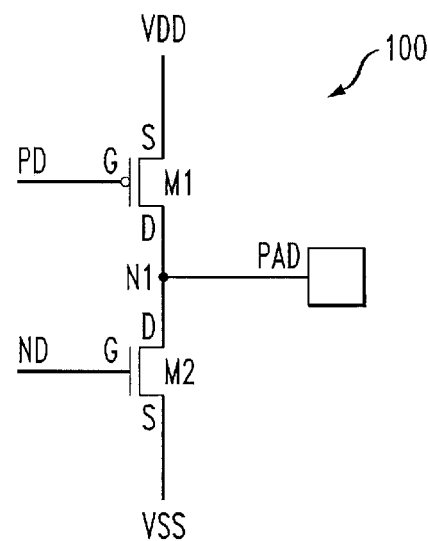
FIG. 1 is a schematic diagram illustrating a conventional complementary metal-oxide-semiconductor (CMOS) digital output buffer circuit.

FIG. 1 is a schematic diagram illustrating a basic digital output stage 100 which may be used, for example, in a conventional CMOS digital output buffer circuit. The digital output stage 100 includes a PMOS device M1 having a source terminal (S) connected to a positive supply voltage, which may be VDD, a drain terminal (D) connected to an output pad (PAD) at node N1, and a gate terminal (G) for receiving a first digital input signal PD. The output stage 100 further includes an NMOS device M2 having a source terminal connected to VSS, which may be ground, a drain terminal connected to the output pad at node N1, and a gate terminal for receiving a second digital input signal ND. When the gate terminals of devices M1 and M2 are both a logic high ("1"), M2 will be turned on and M1 will be turned off, resulting in node N1 being a logic low ("0"). When the gate terminals of devices M1 and M2 are both low, M1 will be turned on and M2 will be turned off, resulting in node N1 being high. When the gate terminal of device M1 is high and the gate terminal of device M1 is low, both M1 and M2 will be turned off, resulting in node N1 essentially floating.

An advantage of a digital output stage over alternative output stage configurations is that the digital output stage can source and/or sink relatively large currents (e.g., several tens of milliamperes), depending on the sizes (e.g., channel width-to-length (W/L) ratio) of devices M1 and M2, respectively, thereby providing a substantially low output impedance. This is due, at least in part, to the fact that the signals driving the gate terminals of devices M1 and M2 are essentially full-scale voltages (e.g., VDD or VSS). However, under certain conditions, the low output impedance provided by the digital output stage presents a problem. For example, when a contention condition arises, a significantly large "over current" will flow out from the PMOS device M1 or into the NMOS device M2. A contention condition may be defined herein as a condition wherein a logic "high" output signal generated at an output of the buffer circuit (e.g., node N1) is somehow shorted to VSS, or, similarly, wherein a logic "low" output signal of the buffer circuit is somehow shorted to VDD. This large over current, which can be about 50 mA or higher, can cause severe reliability problems due, at least in part, to electromigration damage in the metal connecting device M1 to VDD and to the output pad, or connecting device M2 to VSS and to the output pad. The over current may also damage the output devices M1, M2 themselves.

This contention problem has been conventionally addressed by substantially increasing the size of the metal connections in the output paths of the two devices M1 and M2, at the expense, however, of a significant increase in the overall size of the buffer circuit. Additionally, while it is desirable, and necessary in certain applications, to be able to limit the current sourcing or sinking capability of the buffer circuit under such a contention condition, there has been no known means for providing current limiting while at the same time assuring a low output impedance drive under normal operation of the buffer circuit (e.g., when no contention condition exists).

Figure 2:
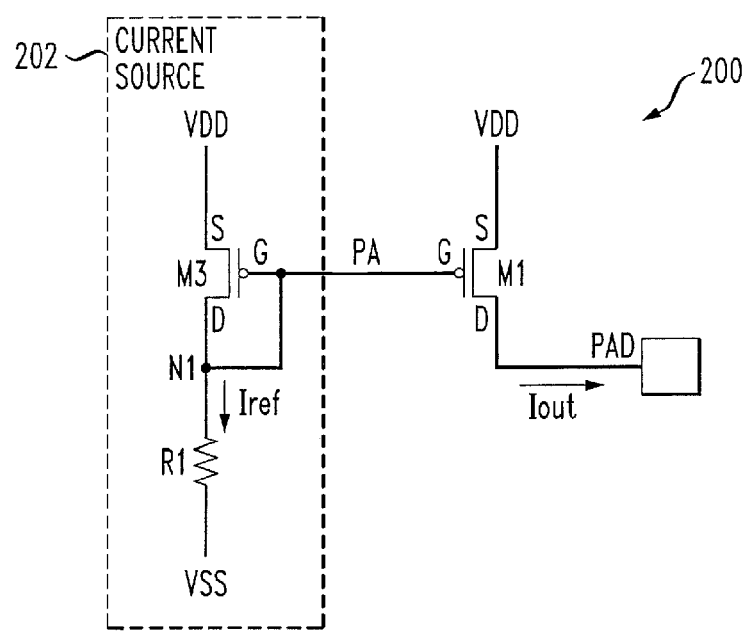
FIG. 2 is a schematic diagram illustrating a conventional CMOS analog output buffer circuit.

FIG. 2 is a schematic diagram illustrating a basic analog output stage 200 which may be used, for example, in a conventional analog output buffer circuit. The analog output stage 200 includes a PMOS device M1 having a source terminal connected to VDD, a drain terminal connected to an output pad (PAD), and a gate terminal for receiving an analog bias signal PA. In the figure, only the current sourcing portion of the analog output stage is shown, namely, the PMOS device M1, although a similar arrangement may be employed using an NMOS device (not shown) providing a means for sinking current. The bias signal PA may be generated by a bias source 202 comprising a PMOS device M3 connected in a diode configuration to a bias resistor R1. Specifically, a source terminal of device M3 is connected to VDD, drain and gate terminals are connected to a first end of resistor R1 at node N1 for generating the bias signal PA, and a second end of resistor R1 is connected to VSS. A current Iref flowing through M3 and R1 will be equal to (VDD−Vtp)/R1, where Vtp is the threshold voltage of PMOS device M3, generally about 0.7 volt.

Devices M1 and M3 essentially form a simple current mirror, since the gate-to-source voltages of devices M1 and M3 will be identical. The total amount of current Iout sourced by device M1 will depend primarily on the size of M1 relative to device M3. The size of a given device is generally defined in terms of the W/L ratio of a channel region in the device, as previously stated. By way of example only, assuming device M3 has a width, W, of 10 micrometers (μm) and a length, L, of 1 μm, while device M1 has a width of 20 μm and a length of 1 μm, the size (W/L) of device M1 is twice that of device M3. Consequently, the current Iout through device M1 will be about twice that of current Iref through device M3. The current Iout will also depend, to some extent, on the voltage at the output pad. In this instance, an upper limit of current Iout through device M1 will not exceed about twice that of current Iref through device M3, but the lower limit of Iout will be reduced as the voltage at the output pad approaches VDD.

In many applications, the output stage of a buffer circuit is required to provide a substantially low impedance (e.g., about ten ohms or less) when sourcing or sinking current. The digital-output stage 100 shown in FIG. 1 allows for a much lower output impedance than the analog output stage 200 depicted in FIG. 2, since the output device M1 in the digital output stage 100 can have a gate-to-source voltage (Vgs) of VDD, while the output device M1 in the analog output stage 200 has a Vgs that is significantly less than VDD, typically only a few tenths of a volt greater than the threshold voltage Vtp of the device. For instance, for a conventional 3.3-volt process technology, the nominal supply voltage VDD is 3.3 volts, and a typical PMOS device threshold voltage Vtp is about 0.7 volt. The digital PMOS device Vgs will therefore be about 3.3 volts, while the analog PMOS device Vgs will be about 1.0 volt. Accordingly, in order for a buffer circuit to meet such low output impedance requirements, a digital output stage should be employed.

Unfortunately, since standard digital output stages do not provide a current limiting mechanism, the over current generated by the output stage devices can cause reliability problems resulting primarily from electromigration damage in the metal connections of the output path and/or damage to the output stage devices themselves, as previously explained. In order to advantageously reduce the likelihood of such damage occurring, the present invention provides, in illustrative embodiments, a buffer circuit comprising an output stage which is operative in one of at least a digital drive mode and an analog drive mode, as will be described in further detail below.

Figure 3:
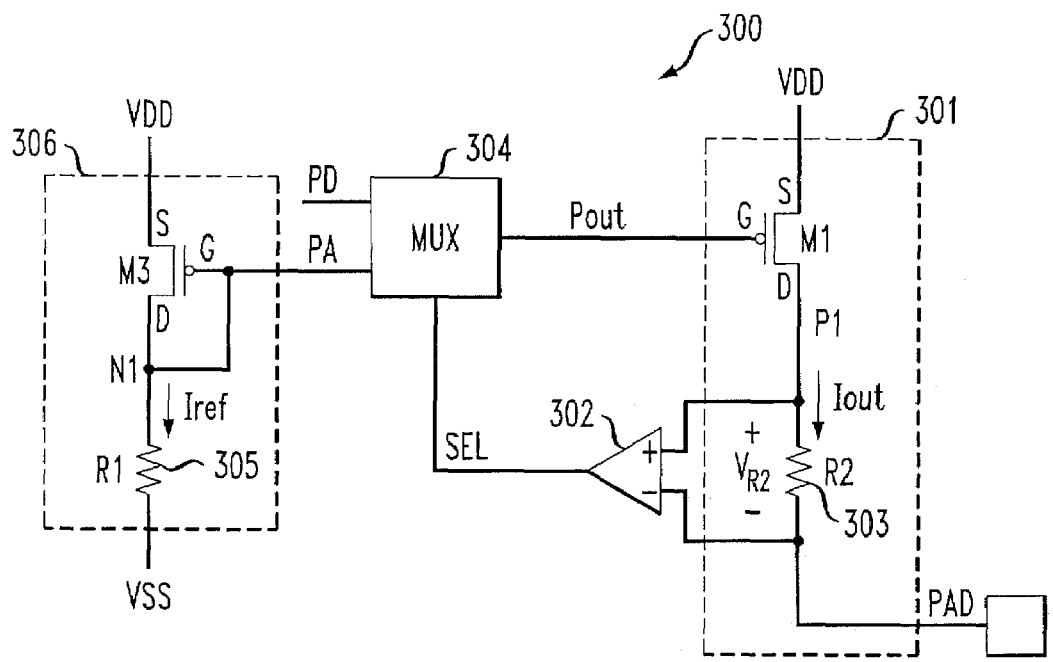
FIG. 3 is a schematic diagram depicting at least a portion of an exemplary output buffer circuit including current limiting, formed in accordance with one embodiment of the present invention.

FIG. 3 is a schematic diagram depicting at least a portion of an exemplary buffer circuit 300, formed in accordance with one embodiment of the invention. It is to be understood that the term "buffer circuit" as may be used herein is intended to refer not only to output buffers, but may also include other types of buffers, such as, but not limited to, bidirectional buffers, inverting buffers, non-inverting buffers, etc., as will be known by those skilled in the art. The exemplary buffer circuit 300 includes an output stage 301, a comparator 302, or alternative detector circuitry, and a multiplexer (MUX) 304, or alternative control circuitry. The output stage 301 is connectable to an output pad (PAD), as may be used for providing external access to the buffer circuit 300, and is operative to generate an output signal (e.g., an output current and/or an output voltage) at the output pad which is a function of an input signal (e.g., PD or PA) applied to the buffer circuit.

In the exemplary buffer circuit 300, the output stage 301 comprises a PMOS device M1 having a source terminal connecting to a first source providing a first voltage, which may be VDD, a drain terminal coupled to the output pad through a series-connected resistor 303 having a resistance R2, and a gate terminal connected to an output of the multiplexer 304. While the output stage 301 is shown as adding a logical inversion between the input signal (e.g., PD) and the output signal Vout, the output stage need not be inverting. Alternative output stage arrangements are similarly contemplated by the invention (e.g., non-inverting output stage). Moreover, although the output stage 301 is depicted as including a single PMOS device M1 for sourcing current, it is to be understood that the output stage 301 may further include an NMOS device (not explicitly shown) for sinking current, with the techniques of the present invention described herein being similarly applied to the NMOS device, as will become apparent to those skilled in the art.

The buffer circuit 300 is preferably selectively operative in one of at least two modes, such as, for example, a digital drive mode and at least one analog drive mode. In the digital drive mode, which may be defined as a normal operation wherein no contention condition exists, the buffer circuit 300 provides a substantially low output impedance. In the analog drive mode, wherein a contention condition arises, the buffer circuit 300 preferably provides current limiting. An output signal, Pout, generated by the multiplexer 304 in buffer circuit 300 is preferably either a digital signal, PD, or an analog signal, PA, depending on the logical state of a control signal SEL supplied to a control input of the multiplexer. During normal operation of the buffer circuit 300, the multiplexer 304 is preferably operative in the digital drive mode, wherein the multiplexer electrically connects the digital signal PD to the gate terminal of the PMOS output device M1. Likewise, when a contention condition occurs, the multiplexer 304 is preferably operative in the analog drive mode, wherein the multiplexer electrically connects the analog signal PA to the gate terminal of device M1.

The existence of a contention condition is preferably detected by the comparator 302, which can be a differential comparator as shown. A first input of the comparator 302, which may be a non-inverting (+) input, is preferably connected to a first terminal of resistor 303 at node P1, and a second input of the comparator, which may be an inverting (−) input, is connected to a second terminal of resistor 303 at the output pad of the buffer circuit 300. Comparator 302 is operative to generate the control signal SEL which is representative of a difference in voltage between the first and second inputs. This voltage difference, $V_{R2}$, which is also equal to the voltage across resistor 303, is a function of the current Iout sourced by the output stage device M1 according to the expression $V_{R2}=Iout \times R2$. The resistance R2 is preferably substantially small, such as, for example, a few ohms, so as to keep the voltage difference $V_{R2}$ relatively small (e.g., tens of millivolts (mV)). The invention, however, is not limited to any particular resistance value for resistor 303.

Resistor 303 may comprise, for example, substantially wide metal appropriately sized to handle a maximum anticipated output current Iout without damaging the resistor 303, although alternative materials (e.g., polysilicon, diffusion, etc.) may be similarly used to form the resistor. By way of example only, assume that R2 is about 2 ohms, and that a maximum current Iout that can be sourced by PMOS device M1 is about 30 mA. The differential comparator 302 is therefore preferably configured having an internal switching threshold of about 60 mV, so that when the voltage across resistor 303 is less than about 60 mV, the comparator output SEL is low, thereby enabling the multiplexer 304 to select the digital signal PD to drive device M1 in the digital drive mode. Conversely, when the voltage across resistor 303 exceeds 60 mV, indicating that the output current Iout exceeds 30 mA, the comparator output SEL switches high, thereby causing the multiplexer 304 to select the analog signal PA to drive device M1 in the analog drive mode, limiting the current Iout to a specified amount.

The analog signal PA may be generated by a bias source 306, which may be included in the buffer circuit 300. Bias source 306 may alternatively reside external to the buffer circuit 300. In some instances, for example, when a plurality of buffer circuits are employed, a single bias source may generate a global analog signal that is shared by more than one buffer circuit. Bias source 306 may comprise a basic reference circuit, including a diode-configured PMOS device M3 connected to VSS through a series resistor 305 having a resistance R1 associated therewith. Specifically, a source terminal of device M3 is preferably connected to VDD, gate and drain terminal of M3 are preferably connected to a first end of resistor 305 at node N1 to generate the analog signal PA, and a second end of resistor 305 is preferably connected to VSS. The bias source 306 may comprise an alternative reference circuit, such as, but not limited to, a bandgap reference, etc., as will be understood by those skilled in the art.

A reference current Iref flowing through device M3 can be adjusted based primarily on the resistance R1 of resistor 305. In order to minimize current consumption in the bias source 306, resistor 305 is preferably substantially high in value, such as, for example, about 100 kilo (k) ohms or higher. Assuming VSS is equal to zero (e.g., ground), the current Iref will be about (VDD−Vtp)/R1, where Vtp is a threshold voltage of PMOS device M3. In the analog drive mode, bias signal PA will be electrically connected to the gate terminal of device M1, thereby essentially forming a current mirror between devices M3 and M1. Thus, the output current Iout generated by M1 will be limited as a function of the reference current Iref generated by M3. By way of example only and without loss of generality, assuming device M1 is one hundred times larger in size (W/L) than device M3, if Iref is about 100 microamperes (μA), Iout will be limited to about 10 mA in the analog drive mode.

In order to reduce power consumption in the buffer circuit, the bias source 306 may include power-down circuitry (not shown) for selectively disabling at least a portion of the bias source in response to a control signal when the bias signal PA is not being used, such as, for example, during the first mode of operation of the buffer circuit 300. The control signal for disabling the bias source 306 may be a function of the output signal of the buffer circuit. In a preferred embodiment, the control signal SEL for selecting the mode of operation of the buffer circuit may also be used to at least partially disable the bias source 306, as will be understood by those skilled in the art.

Figure 4:
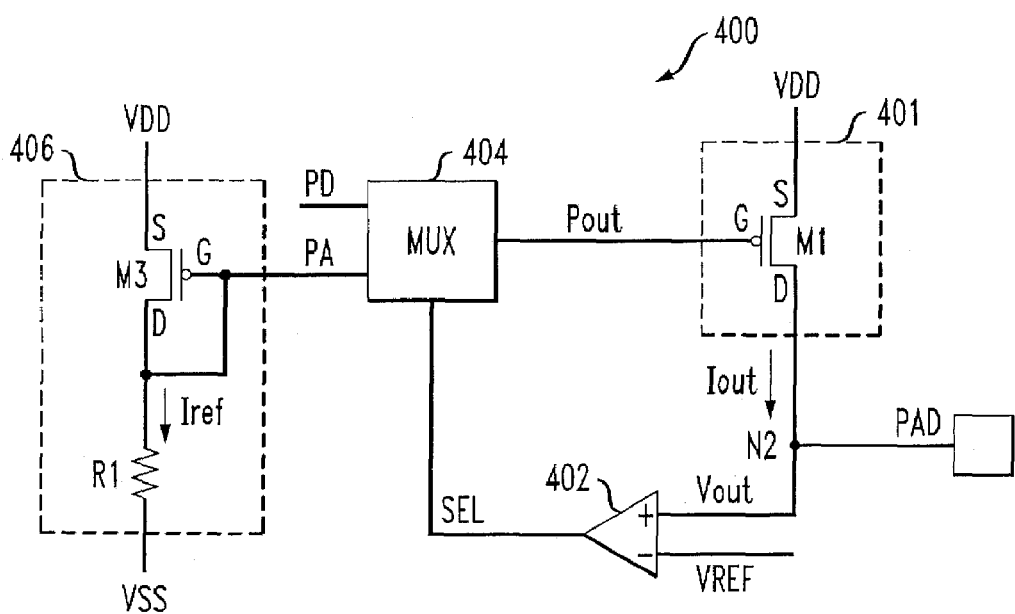
FIG. 4 is a schematic diagram depicting an exemplary buffer circuit including current limiting, formed in accordance with a second embodiment of the present invention.

FIG. 4 is a schematic diagram depicting at least a portion of an exemplary buffer circuit 400, formed in accordance with a second embodiment of the invention. The exemplary buffer circuit 400 comprises an output stage 401 connecting to an output pad (PAD) and generating an output current Iout, a comparator 402, or alternative detector circuit, and a multiplexer 404, or alternative control circuitry. The output stage 401 comprises a PMOS device M1 having a source terminal connecting to VDD, a drain terminal connected to the output pad at node N2, and a gate terminal connected to an output of the multiplexer 404. The multiplexer 404 preferably includes a first input for receiving a digital signal PD, and a second input for receiving an analog signal PA. Analog signal PA may be generated by a bias source 406. The bias source 406 may comprise a diode-configured PMOS device M3 connected to VSS via a series resistor R1, although alternative bias circuits (e.g., bandgap reference, etc.) may be similarly employed. A similar circuit arrangement can be employed using an NMOS device (not shown) in the output stage 401 for providing current sinking, as will become apparent to those skilled in the art.

Like the illustrative buffer circuit 300 shown in FIG. 3, buffer circuit 400 is selectively operable in one of at least two modes, such as, for example, a digital drive mode and an analog drive mode. In the digital drive mode, which may be defined as a normal operation wherein no contention condition exists, the buffer circuit 400 provides a substantially low output impedance. In the analog drive mode, wherein a contention condition arises, the buffer circuit 400 preferably provides current limiting. The buffer circuit 400 is preferably arranged in a manner similar to the buffer circuit 300 shown in FIG. 3, except that in buffer circuit 400 the comparator 402 is configured to measure an output voltage Vout at node N2, rather than an output current, as in the buffer circuit 300. With reference to FIG. 3, the illustrative buffer circuit 300 measures a differential voltage $V_{R2}$ developed across resistor 303, which is of a known value R2, thereby indirectly measuring the output current Iout generated by the output stage 301 in accordance with the relation Iout=$V_{R2}$/R2, as will be understood by those skilled in the art.

As apparent from FIG. 4, the comparator 402 includes a first input, which may be a non-inverting (+) input, connected to the output pad at node N2, a second input, which may be an inverting (−) input, for receiving a reference voltage VREF. The comparator 402 is operative to generate a control signal SEL which is representative of a difference between the voltage Vout at node N2 and the reference voltage VREF. Control signal SEL may be used for controlling the multiplexer 404 in a manner similar to that described in conjunction with the buffer circuit 300 shown in FIG. 3. The current-to-voltage conversion which was performed by the resistor 303 in the buffer circuit 300 (see FIG. 3) is instead performed by PMOS transistor M1 in the output stage 401 of exemplary buffer circuit 400. This may be accomplished by determining an output resistance of M1, and then determining a minimum allowable voltage at node N2 so as to avoid too high an over current at the output pad. The reference voltage VREF is preferably set substantially equal to this minimum allowable voltage.

By way of example only, when Vout is above VREF, the control signal SEL generated by the comparator 402 will be a logic high, thereby allowing the multiplexer 404 to select, as its output Pout, a digital signal PD supplied to an input of the multiplexer. The output Pout of the multiplexer 404 is connected to for driving the gate terminal of device M1. Likewise, when Vout goes below VREF, the control signal SEL will be a logic low, thereby allowing the multiplexer 404 to select, as its output Pout, the analog signal PA supplied to the multiplexer for driving the gate terminal of M1, which beneficially limits the maximum current sourced by the output stage 401.

Figure 5:
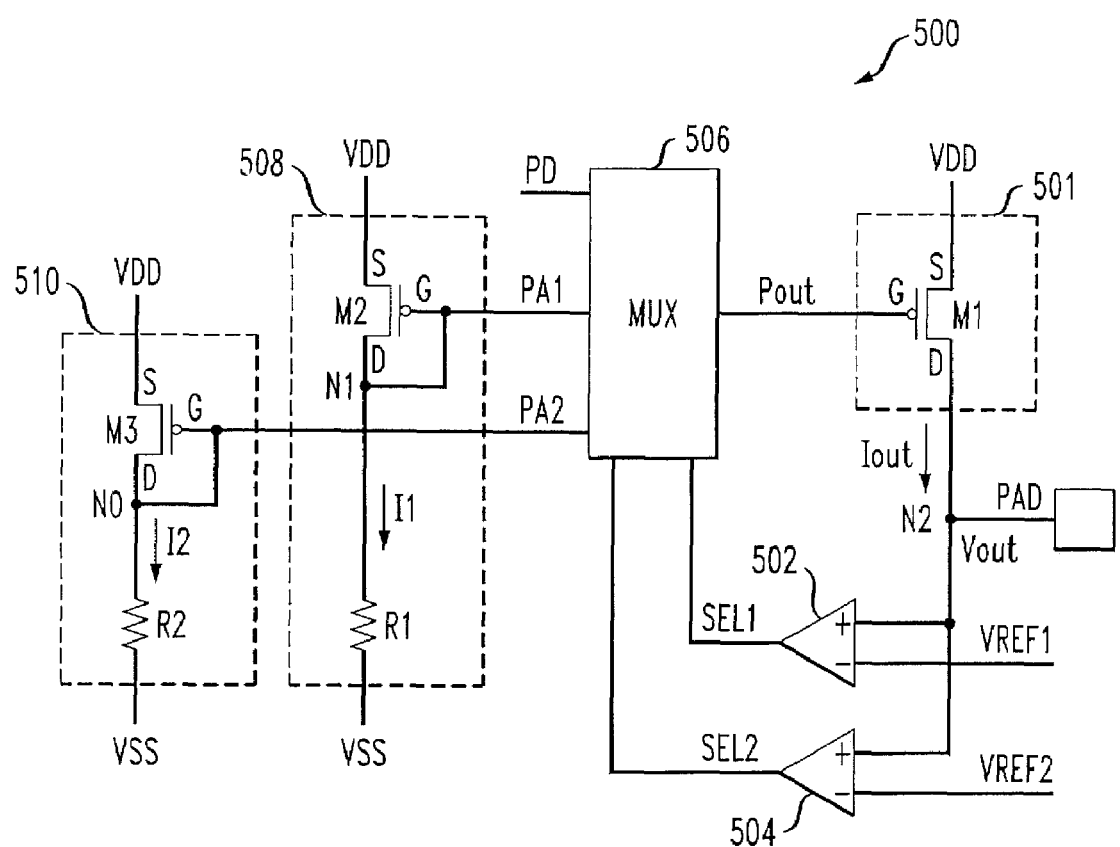
FIG. 5 is a schematic diagram depicting an exemplary buffer circuit including multiple levels of current limiting, formed in accordance with a third embodiment of the present invention.

FIG. 5 is a schematic diagram depicting at least a portion of an exemplary buffer circuit 500, formed in accordance with a third embodiment of the invention. The exemplary buffer circuit 500 comprises an output stage 501 connectable to an output pad (PAD), first and second comparators 502 and 504, respectively, or alternative detection circuitry, and a multiplexer 506, or alternative control circuitry. The output stage 501 preferably includes a PMOS device M1 having a source terminal connecting to VDD, a drain terminal connected to the output pad at node N2, and a gate terminal connected to an output of the multiplexer 506. Alternative output stage arrangements are similarly contemplated by the invention. For example, although output stage 501 is depicted as including a single PMOS device M1 for sourcing current, it is to be understood that the output stage may further include an NMOS device (not shown) for sinking current, with the techniques of the present invention described herein similarly applied to the NMOS device, as will become apparent to those skilled in the art.

The buffer circuit 500 is selectively operative in one of at least three modes. For example, in a preferred embodiment, the buffer circuit 500 is operative in a digital drive mode, and first and second analog drive modes. In the digital drive mode, which may be defined as a normal operation wherein no contention condition exists, the buffer circuit 500 provides a substantially low output impedance (e.g., less than about ten ohms). In the first analog drive mode, wherein an output voltage, Vout, of the buffer circuit 500 is above a first threshold level, the buffer circuit is preferably operative to limit an output current, Iout, of the output stage 501 to a first specified level. In the second analog drive mode, wherein the output voltage Vout is above a second threshold level, the buffer circuit 500 is operative to limit the output current Iout to a second specified level. An output signal, Pout, generated by the multiplexer 506 in buffer circuit 500 is preferably either a digital signal, PD, a first analog signal, PA1, or a second analog signal PA2, depending on whether the buffer circuit is operating in the digital mode, first analog mode, or second analog mode, respectively. Specifically, during the digital mode, the multiplexer 506 preferably electrically connects the digital signal PD to the gate terminal of the PMOS output device M1. Likewise, in the first or second analog drive modes, the multiplexer 506 electrically connects the first analog signal PA1 or the second analog signal PA2, respectively, to the gate terminal of device M1.

The operating mode of the multiplexer 506 is controlled as a function of logic states of control signals SEL1 and SEL2 supplied to corresponding control inputs of the multiplexer. With two control inputs, the multiplexer 506 can selectively connect one of four possible inputs to the output, as will be understood by those skilled in the art. The present invention, however, is not limited to the number of control signals and/or inputs shown. Control signals SEL1 and SEL2 are preferably generated by comparators 502 and 504, respectively. Each of comparators 502, 504 is preferably operative to measure a difference between the output voltage Vout of the buffer circuit 500 and a reference voltage, namely, VREF1 or VREF2, respectively. Specifically, when Vout is above reference voltage VREF1, control signal SEL1 generated by comparator 502 will be a logic high ("1"), and when Vout is less than or about equal to VREF1, SEL1 will be a logic low ("0"). Likewise, when Vout is above reference voltage VREF2, control signal SEL2 generated by comparator 504 will be a logic high, and when Vout is less than or about equal to VREF2, SEL2 will be a logic low. Reference voltage VREF1 is preferably set to be substantially equal to the first threshold level, and reference voltage VREF2 is set to be substantially equal to the second threshold level.

First and second analog signals PA1, PA2 may be generated by bias sources 508 and 510, respectively. Bias source 508 may comprise a diode-configured PMOS device M2 connected to VSS via a series resistor R1, although alternative bias circuits (e.g., bandgap reference, etc.) may be similarly employed. Specifically, a source terminal of device M2 preferably connects to VDD, drain and gate terminals of M2 are connected to a first end of resistor R1 at node N1, and a second end of R1 connects to VSS. Likewise, bias source 510 may comprise a diode-configured PMOS device M3 connected to VSS via a series resistor R2. Specifically, a source terminal of device M3 preferably connects to VDD, drain and gate terminals of M2 are connected to a first end of resistor R2 at node N0, and a second end of R1 connects to VSS.

A bias current, I1, flowing through device M2 may be controlled as a function of a size (e.g., W/L ratio) of M2 and/or a resistance value of resistor R1. A bias current, I2, flowing through device M3 may be controlled as a function of a size of M3 and/or a resistance value of resistor R2. When signal PA1 is connected to the gate terminal of device M1, such as during the first analog drive mode, a current mirror is formed between devices M2 and M1, such that the output current Iout of the buffer circuit 500 will be limited as a function of the bias current I1. Likewise, when signal PA2 is connected to the gate terminal of device M1, such as during the second analog drive mode, a current mirror is formed between devices M3 and M1, such that the output current Iout of the buffer circuit 500 will be limited as a function of the bias current I2. Bias currents I1 and I2 are preferably different relative to one another. In this manner, the buffer circuit 500 may provide multiple levels of output current limiting.

By way of example only and without loss of generality, assume devices M1, M2 and M3 are all of the same size. When the output voltage Vout of buffer circuit 500 is above both VREF1 and VREF2, such as during a normal mode of operation wherein no contention condition exists, the control signals SEL1 and SEL2 will be high (logic "1"), thereby causing the multiplexer 506 to connect digital signal PD to the gate terminal of device M1. The output stage 501 thus operates in a digital drive mode, providing a substantially low output impedance. When the output voltage Vout goes below VREF1 but is above VREF2, control signal SEL1 will be low (logic "0") and control signal SEL2 will be high, thereby causing the multiplexer 506 to connect first analog signal PA1 to the gate terminal of device M1, limiting the output current Iout as a function of bias current 11. When Vout goes below both VREF1 and VREF2, both control signals SEL1 and SEL2 will be low, thereby causing the multiplexer 506 to connect second analog signal PA2 to the gate terminal of M1, limiting the output current Iout as a function of bias current I2.

At least a portion of the buffer circuit of the present invention may be implemented in an integrated circuit. In forming integrated circuits, a plurality of identical die is typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. An apparatus, comprising:
   a buffer circuit configured to generate an output signal which is a function of an input signal received by the buffer circuit, the buffer circuit being selectively operative in one of at least two modes in response to a control signal, wherein in a first mode the buffer circuit is configured to provide a designated output impedance, and in a second mode the buffer circuit is configured to limit an output current of the buffer circuit to a designated nonzero amount, the control signal being indicative of a level of the output signal of the buffer circuit.

2. The buffer circuit of claim 1, further comprising:
   an output stage operative to generate the output signal of the buffer circuit; and
   a control circuit connected to the output stage, wherein in the first mode the control circuit is operative to generate a signal for driving the output stage which is a function of the input signal received by the buffer circuit, and in the second mode the control circuit is operative to generate the signal for driving the output stage which is a function of a bias signal supplied to the control circuit, the output current of the buffer circuit, in the second mode, being a function of the bias signal.

3. The buffer circuit of claim 1, further comprising:
an output stage connectable to an output pad and operative to generate the output signal of the buffer circuit; and
a multiplexer connected to the output stage, the multiplexer including a first input for receiving the input signal and a second input for receiving a bias signal, wherein in the first mode the multiplexer is operative to electrically connect the input signal to the output stage, and in the second mode the multiplexer is operative to electrically connect the bias signal to the output stage, the output current of the buffer circuit, in the second mode, being a function of the bias signal.

4. The buffer circuit of claim 1, further comprising a detector circuit operative to receive a signal representative of the output signal and to generate the control signal in response thereto.

5. The buffer circuit of claim 1, further comprising a detector circuit operative to receive at least a portion of the output signal and to generate the control signal in response thereto.

6. The buffer circuit of claim 5, wherein the detector circuit comprises at east one comparator operative to measure at least a portion of the output signal and to generate the control signal being indicative of a level of the output signal.

7. The buffer circuit of claim 1, further comprising an output stage, wherein in the first mode the output stage is operative in a digital drive configuration, and in the second mode the output stage is operative in an analog drive configuration.

8. The buffer circuit of claim 7, wherein the output stage comprises a PMOS transistor device having a source terminal connecting to a first source providing a first voltage, a drain terminal connected to an output of the buffer circuit, and a gate terminal for receiving, in the first mode, a signal representative of the input signal, and for receiving, in the second mode, a bias signal, a level of the output current of the buffer circuit, in the second mode, being limited as a function of the bias signal.

9. The buffer circuit of claim 1, wherein the first mode comprises a digital drive mode, and the second mode comprises an analog drive mode.

10. The buffer circuit of claim 1, further comprising:
an output stage including a PMOS device having a source terminal connecting to a first source providing a first voltage, a drain terminal connecting to an output pad via a series resistor, and a gate terminal for receiving, in the first mode, a signal representative of the input signal, and for receiving, in the second mode, a bias signal for limiting the output current of the buffer circuit; and
a comparator having a first input connected to a first end of the resistor and a second input connected to a second end of the resistor, the comparator being operative to generate the control signal, the control signal being a function of a voltage across the resistor;
wherein a switching threshold of the comparator is selectively controlled as a function of a resistance value of the resistor.

11. The buffer circuit of claim 1, further comprising a comparator having a first input for receiving a signal representative of a level of the output signal, and a second input for receiving a reference voltage, the comparator being operative to generate the control signal, the control signal being a function of a difference between the level of the output signal and the reference voltage, wherein a switching threshold of the comparator is selectively controlled as a function of the reference voltage.

12. The buffer circuit of claim 1, further comprising a bias source operative to generate a bias signal, wherein the output current, in the second mode, is limited as a function of the bias signal.

13. The buffer circuit of claim 1, wherein the buffer circuit is selectively operative in one of at least three modes in response to at least first and second control signals, wherein in the first mode the buffer circuit is configured to generate the output signal which is a function of the input signal received by the buffer circuit and to provide a low output impedance, in the second mode the buffer circuit is configured to limit the output current of the buffer circuit to a first amount, and in a third mode the buffer circuit is configured to limit the output current of the buffer circuit to a second amount, the first and second control signals being indicative of at least first and second levels of the output signal.

14. The buffer circuit of claim 13, further comprising:
an output stage connectable to an output pad and operative to generate the output signal of the buffer circuit; and
a multiplexer connected to the output stage, the multiplexer including a first input for receiving the input signal, a second input for receiving a first bias signal, and a third input for receiving a second bias signal, wherein in the first mode the multiplexer is operative to electrically connect the input signal to the output stage, in the second mode the multiplexer is operative to electrically connect the first bias signal to the output stage, and in the third mode the multiplexer is operative to electrically connect the second bias signal to the output stage, the output current of the buffer circuit, in the second and third modes, being a function of the first and second bias signals, respectively.

15. The buffer circuit of claim 13, further comprising:
a first comparator having a first input for receiving a signal representative of a level of the output signal, and a second input for receiving a first reference voltage, the first comparator being operative to generate the first control signal, the first control signal being a function of a difference between the level of the output signal and the first reference voltage; and
a second comparator having a first input for receiving the signal representative of a level of the output signal, and a second input for receiving a second reference voltage, the second comparator being operative to generate the second control signal, the second control signal being a function of a difference between the level of the output signal and the second reference voltage.

16. An integrated circuit, comprising:
at least one buffer circuit, the at least one buffer circuit being configurable to generate an output signal which is a function of an input signal received by the buffer circuit, the buffer circuit being selectively operative in one of at least two modes in response to a control signal, wherein in a first mode the buffer circuit is configured to provide a designated output impedance, and in a second mode the buffer circuit is configured to limit an output current of the buffer circuit to a designated nonzero amount, the control signal being indicative of a level of the output signal of the buffer circuit.

17. The integrated circuit of claim 16, wherein the at least one buffer circuit farther comprises:
an output stage operative to generate the output signal of the buffer circuit; and a control circuit connected to the output stage, wherein in the first mode the control circuit is operative to generate a signal for driving the output stage which is a function of the input signal received by the buffer circuit, and in the second mode the control circuit is operative to generate the signal for driving the output stage which is a function of a bias signal supplied to the control circuit, the output current of the buffer circuit, in the second mode, being a function of the bias signal.

18. The integrated circuit of claim 16, wherein the at least one buffer circuit further comprises:
    an output stage connectable to an output pad and operative to generate the output signal of the buffer circuit; and
    a multiplexer connected to the output stage, the multiplexer including a first input for receiving the input signal and a second input for receiving a bias signal, wherein in the first mode the multiplexer is operative to electrically connect the input signal to the output stage, and in the second mode the multiplexer is operative to electrically connect the bias signal to the output stage, the output current of the buffer circuit, in the second mode, being a function of the bias signal.

19. The integrated circuit of claim 16, wherein the at least one buffer circuit further comprises a bias source operative to generate a bias signal, wherein the output current, in the second mode, is limited as a function of the bias signal.

20. The integrated circuit of claim 16, wherein the at least one buffer circuit is selectively operative in one of at least three modes in response to at least first and second control signals, wherein in the first mode the buffer circuit is configured to generate the output signal which is a function of the input signal received by the buffer circuit and to provide a low output impedance, in the second mode the buffer circuit is configured to limit the output current of the buffer circuit to a first amount, and in a third mode the buffer circuit is configured to limit the output current of the buffer circuit to a second amount, the first and second control signals being indicative of at least first and second levels of the output signal.

* * * * *